(12) United States Patent
Czimmek

(10) Patent No.: US 9,285,403 B2
(45) Date of Patent: Mar. 15, 2016

(54) RESISTANCE DETERMINATION FOR TEMPERATURE CONTROL OF HEATED AUTOMOTIVE COMPONENTS

(71) Applicant: Continental Automotive Systems, Inc., Auburn Hills, MI (US)

(72) Inventor: Perry Robert Czimmek, Williamsburg, VA (US)

(73) Assignee: Continental Automotive Systems, INC, Auburn Hills, MI (US)

( * ) Notice: Subject to any disclaimer, the term of this patent is extended or adjusted under 35 U.S.C. 154(b) by 118 days.

(21) Appl. No.: 14/135,021

(22) Filed: Dec. 19, 2013

(65) Prior Publication Data

US 2014/0197854 A1    Jul. 17, 2014

Related U.S. Application Data

(60) Provisional application No. 61/747,544, filed on Dec. 31, 2012.

(51) Int. Cl.
*G01R 27/08*    (2006.01)

(52) U.S. Cl.
CPC . *G01R 27/08* (2013.01); *Y02T 10/47* (2013.01)

(58) Field of Classification Search
USPC .......... 324/713, 202, 225, 322, 657, 706, 324/750.01; 318/811, 810, 599, 807, 808; 219/472, 492, 494, 498, 504, 506, 497; 332/119, 151; 363/21.1, 21.11, 26, 39, 363/41; 340/660, 870.19
See application file for complete search history.

(56) References Cited

U.S. PATENT DOCUMENTS

| | | | |
|---|---|---|---|
| 3,334,296 A * | 8/1967 | Rogal et al. | 324/705 |
| 4,858,576 A * | 8/1989 | Jeffries et al. | 123/145 A |
| 5,904,902 A | 5/1999 | Matuoka et al. | |
| 2003/0039299 A1 * | 2/2003 | Horovitz et al. | 374/141 |
| 2011/0270568 A1 | 11/2011 | Hirai et al. | |
| 2011/0276252 A1 | 11/2011 | Kabasin et al. | |

FOREIGN PATENT DOCUMENTS

WO    2012/089707 A2    7/2012
WO    2013/060630 A    5/2013

OTHER PUBLICATIONS

Search Report dated Jul. 3, 2013, from corresponding GB Patent Application No. GB1303851.8.

* cited by examiner

*Primary Examiner* — Melissa Koval
*Assistant Examiner* — Nasima Monsur

(57) ABSTRACT

Electrical resistance of a heated component is determined for temperature control and monitoring. A voltage-representation signal, which is proportional to a voltage across a heater component, is received. A current-representation signal, which is proportional to an electrical current passing through the heater component is received and modulated to generate a resistance-representation signal that is proportional to an amount of modulation that makes the current-representation signal approximately equal to the voltage-representation signal. The modulation may be pulse-width modulation. The resistance-representation signal may be generated based on a signal that is proportional to the percent duty cycle of the pulse width modulation. A difference of the resistance-representation signal and the voltage-representation signal may be integrated to provide an error signal adapted to cause the modulation to be proportional to an electrical resistance of the heater component.

14 Claims, 4 Drawing Sheets

RESISTANCE DETERMINATION FOR TEMPERATURE CONTROL OF HEATED AUTOMOTIVE COMPONENTS

CROSS-REFERENCE TO RELATED APPLICATIONS

This application is related to the following 5 U.S. provisional patent applications:

Using Resistance Equivalent to Estimate Temperature of a Fuel-Injector Heater, invented by Perry Czimmek, Mike Hornby, and Doug Cosby, filed on Dec. 19, 2013, and identified by application Ser. No. 14/134,686.

Tuned Power Amplifier With Loaded Choke For Inductively Heated Fuel Injector, invented by Perry Czimmek, filed on Dec. 19, 2013, and identified by application Ser. No. 14/134,774.

Tuned Power Amplifier with Multiple Loaded Chokes for Inductively Heated Fuel Injectors, invented by Perry Czimmek, filed on Dec. 19, 2013, and identified by application Ser. No. 14/134,834.

Using Resistance Equivalent to Estimate Heater Temperature of an Exhaust Gas After-Treatment Component, invented by Perry Czimmek, Mike Hornby, and Doug Cosby, filed on Dec. 19, 2013, and identified by application Ser. No. 14/134,931.

Resistance Determination with Increased Sensitivity for Temperature Control of Heated Automotive Component, invented by Perry Czimmek, filed on Dec. 19, 2013, and identified by application Ser. No. 14/135,089.

BACKGROUND

Embodiments of the invention relate generally to power electronics for automotive heaters and more particularly for control of heaters for variable spray fuel injectors or electronic catalysts.

There is a continued need for improving the emissions quality of internal combustion engines. At the same time, there is pressure to minimize engine crank times and time from key-on to drive-away, while maintaining maximum fuel economy. These pressures apply to engines fueled with alternative fuels, such as ethanol, as well as to those fueled with gasoline.

During cold temperature engine start, the conventional spark ignition internal combustion engine is characterized by high hydrocarbon emissions and poor fuel ignition and combustibility. Unless the engine is already at a high temperature after stop and hot-soak, the crank time may be excessive, or the engine may not start at all. At higher speeds and loads, the operating temperature increases and fuel atomization and mixing improve.

During an actual engine cold start, the enrichment necessary to accomplish the start leaves an off-stoichiometric fueling that materializes as high tail-pipe hydrocarbon emissions. The worst emissions are during the first few minutes of engine operation, after which the catalyst and engine approach operating temperature. Regarding ethanol fueled vehicles, as the ethanol percentage fraction of the fuel increases to 100%, the ability to cold start becomes increasingly diminished, leading some manufacturers to include a dual fuel system in which engine start is fueled with conventional gasoline, and engine running is fueled with the ethanol grade. Such systems are expensive and redundant.

Another solution to cold start emissions and starting difficulty at low temperature is to pre-heat the fuel to a temperature where the fuel vaporizes quickly, or vaporizes immediately ("flash boils"), when released to manifold or atmospheric pressure. Pre-heating the fuel replicates a hot engine as far as fuel state is considered.

A number of pre-heating methods have been proposed, most of which involve preheating in a fuel injector. Fuel injectors are widely used for metering fuel into the intake manifold or cylinders of automotive engines. Fuel injectors typically comprise a housing containing a volume of pressurized fuel, a fuel inlet portion, a nozzle portion containing a needle valve, and an electromechanical actuator such as an electromagnetic solenoid, a piezoelectric actuator, or another mechanism for actuating the needle valve. When the needle valve is actuated, the pressurized fuel sprays out through an orifice in the valve seat and into the engine.

One technique that has been used in preheating fuel is to resistively heat metallic elements comprising the fuel injector with a time-varying or steady state electrical current. The electrical energy is converted to heat inside a component suitable in geometry and material to be heated by the Joule or Ohm losses that are caused by the flow of current through that component.

The heated fuel injector is useful not only in solving the above-described problems associated with gasoline systems, but is also useful in pre-heating ethanol grade fuels to accomplish successful starting without a redundant gasoline fuel system.

Because the heating technique uses an electrical current, the system includes electronics for providing an appropriate excitation to the component in the fuel injector. This excitation may include controlling the electrical energy and determining when that electrical energy is applied.

Conventional resistive heating is accomplished open-loop, or without control of electrical energy based on a temperature. A remote thermostat or computational model may be incorporated to provide some control to prevent a runaway temperature event and damage to the fuel injector. More sophisticated methods may monitor the current through the heater to estimate the temperature or direct thermocouple, positive/negative temperature coefficient sensor, or other means for determining the temperature for a more precise regulation of injector heater temperature.

The metallic component that is heated will have a positive temperature coefficient of resistance to electrical current (i.e., its electrical resistance will increase as its temperature increases). Ideally, knowing the initial resistance and final resistance would allow the temperature of the component to be known with some degree of precision. The best metals for resistive heaters usually have very small positive temperature coefficients and therefore measurement of the change in resistance by only monitoring current will be desensitized by harness resistance and aging of numerous interconnecting components. Therefore, it becomes difficult to distinguish a change in resistance of the heater component from a change in resistance of other components connected in series.

It would be advantageous to more precisely know the resistance change of the heater component such that control of the temperature may be accomplished.

BRIEF SUMMARY

In accordance with embodiments of the invention, electrical resistance of a heater component is determined for temperature control and monitoring. A voltage-representation signal, which is proportional to a voltage across a heater component, is received. A current-representation signal, which is proportional to an electrical current passing through the heater component is received and modulated to generate a resistance-representation signal that is proportional to an amount of modulation that makes the current-representation signal approximately equal to the voltage-representation signal. The modulation may be pulse-width modulation. The resistance-representation signal may be generated based on a signal that is proportional to the percent duty cycle of the pulse width modulation. A difference of the resistance-representation signal and the voltage-representation signal may be integrated to provide an error signal adapted to cause the modulation to be proportional to an electrical resistance of the heater component.

DETAILED DESCRIPTION

Embodiments of the invention are directed to determining the electrical resistance of a heater component and providing a signal that represents this resistance as an output solution of division equivalent of a signal representing voltage by a signal representing current. Current may be measured by precisely measuring a voltage drop across a small value precision resistor inside an electronics assembly, or "current-sense resistor." This voltage drop is directly proportional to the current flowing through the resistor. Knowledge of this current may then be expanded upon by a precise measurement of voltage across the heater component. With the current through the heater known and the voltage across the heater known, from Ohm's Law, the resistance may be calculated in accordance with the well-known formula R=V/I, where R is resistance, V is voltage, and I is current. The resistance is provided as a voltage proportional to the duty cycle of a Pulse Width Modulated (PWM) signal. The PWM signal has a duty cycle that makes the voltage proportional to current through the heater component equivalent to the voltage proportional to the voltage across the heater component. Embodiments of the invention generate this resistance knowledge, and from this knowledge, the temperature of the heated component may be estimated and then regulated based on the estimated temperature.

Figure 1:
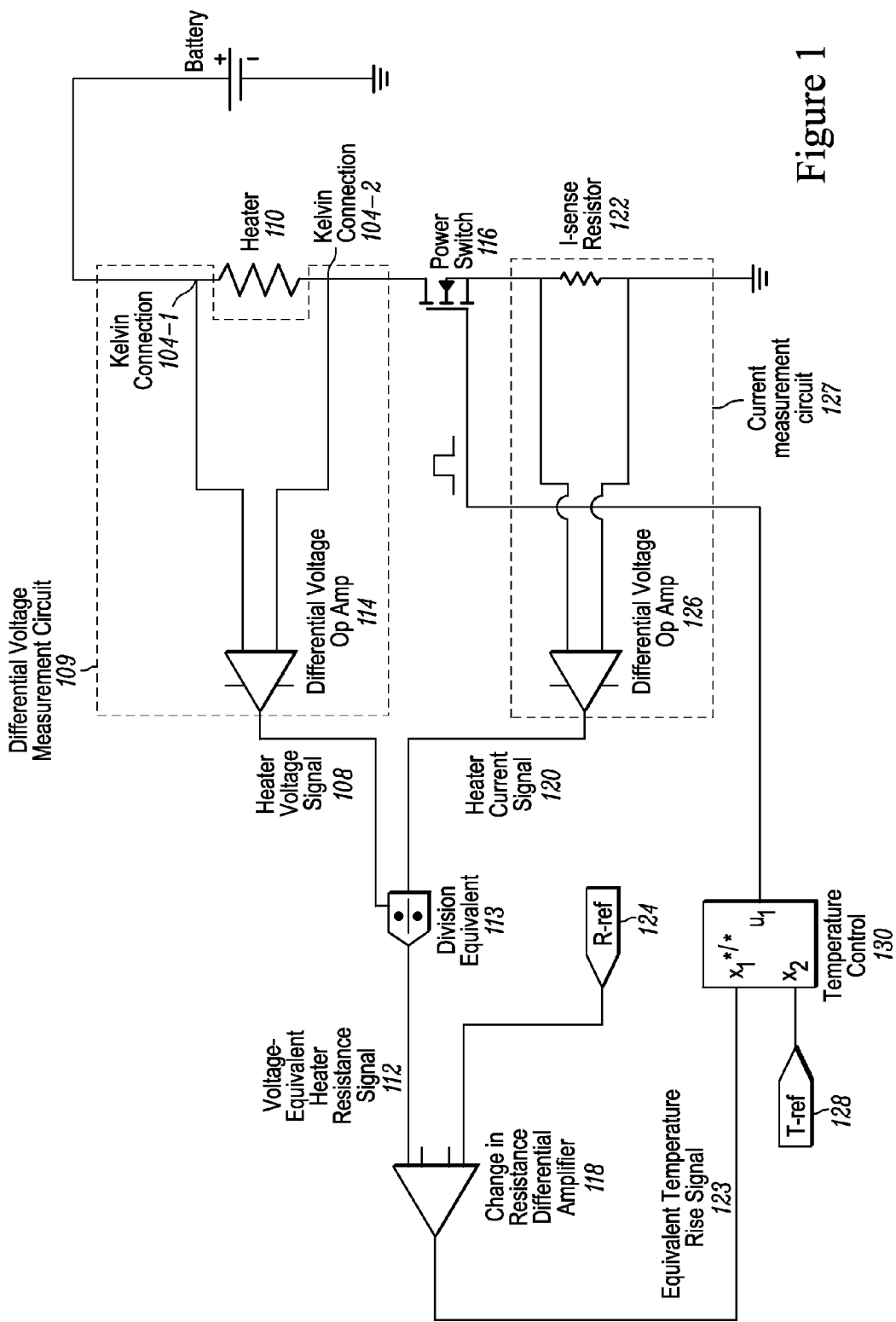
FIG. 1 is a diagrammatic representation of an operating environment for embodiments of the invention.

FIG. 1 is a diagrammatic representation of an operating environment for embodiments of the invention. In FIG. 1, a functional location of embodiments of the invention is depicted as a division equivalent module 113. A heater 110 for an automotive component, including, but not limited to, an inductively heated fuel injector or a heated component used for exhaust gas after treatment, references the heater component of which a resistance, as a function of temperature, is to be determined. An I-sense resistor differential voltage, also referred to as heater current signal 120, represents the electrical current through the I-sense resistor 122 and, therefore, through the heater 110. A current measurement circuit 127 comprises the I-sense resistor 122 and a differential voltage operational amplifier 126. A current sense resistor may be used either on the high side or the low side of the power switch or the load. Current measurement may be done with a hall sensor or with other types of magnetic sensors, such as sense coils.

A differential voltage across the heater, also referred to as heater voltage signal 108, represents the excitation voltage directly related to the current flowing through the heater. The two differential voltages are solved for Ohm's Law relation, R=V/I, using an analog or digital division equivalent 113, to provide a result as a voltage-equivalent heater resistance signal 112. The analog or digital division equivalent 113 may be implemented in accordance with conventional techniques, which are known in the art, by combining operations and components including, but not limited to: summing and shift registers in digital solutions; and logarithmic, sum or difference, and antilogarithm amplification in analog solutions. The change in resistance differential amplifier 118 then finds a difference between the voltage-equivalent heater resistance signal 112 and a resistance reference value, R-ref 124. This generates a delta, or change in resistance, or error, signal that may be brought in as an equivalent temperature rise signal 123 to a temperature control module 130. This equivalent temperature rise signal 123 may be integrated over time, which may be performed computationally or through an analog conversion to perform the integration function, and may be compared to a temperature reference, T-ref 128. The temperature control module 130 may use this comparison to determine if power should be removed from the heater by turning off the power switch 116, represented by a MOSFET in FIG. 1, for this example. The temperature control module 130 may be: a microcontroller, a digital "thermostat", a PID (Proportional Integral Derivative) controller, or any interface that uses the change in temperature (that is represented by the equivalent temperature rise signal) integrated and compared to a target change in temperature, absolute temperature, or some other temperature reference. If the equivalent temperature rise signal 123 is too high, the temperature change is too great, so the power switch 116 may be de-energized thereby turning off the heater 110. A cool-down model may then be used to determine when to turn the heater on again. Or if a continuous set point control strategy is used, then the power switch may be turned on and off rapidly (or operated in a linear region like an analog audio amplifier) to regulate the temperature to a target temperature by repeatedly adjusting heater power.

The differential voltage across the heater 110 may be obtained by a differential voltage measurement circuit 109, which may comprise a differential voltage operational amplifier 114 and a pair of Kelvin connections 104-1 and 104-2 to the heater as close to the actual heater electrical connections as possible. The pair of Kelvin connections refers to the junction where force and sense connections are made. The force component is a high current carrying conductor and the sense component is a parallel wire for obtaining a voltage potential at that connection. There are two Kelvin connections such that one conductor pair carries the current of the heater, and the other conductor pair is used for obtaining the voltage potential. The two pairs of wires may be of different size, with the current carrying pair of an appropriate size to minimize loss, and the voltage potential pair any reasonably small size for the measurement. In this way, these two pairs of wires may be used, in accordance with embodiments of the invention, to perform a four wire measurement.

To measure the differential voltage, the load, or heater, may be one leg of a Wheatstone bridge that is balanced. And then any change in the load would result in an unbalance of the Wheatstone bridge, and, therefore, a different voltage across the load. Or a resistance divider may be located locally at the heater or load. And then the voltage from the resistance divider may be brought back to the electronics for interpretation.

Figure 2:
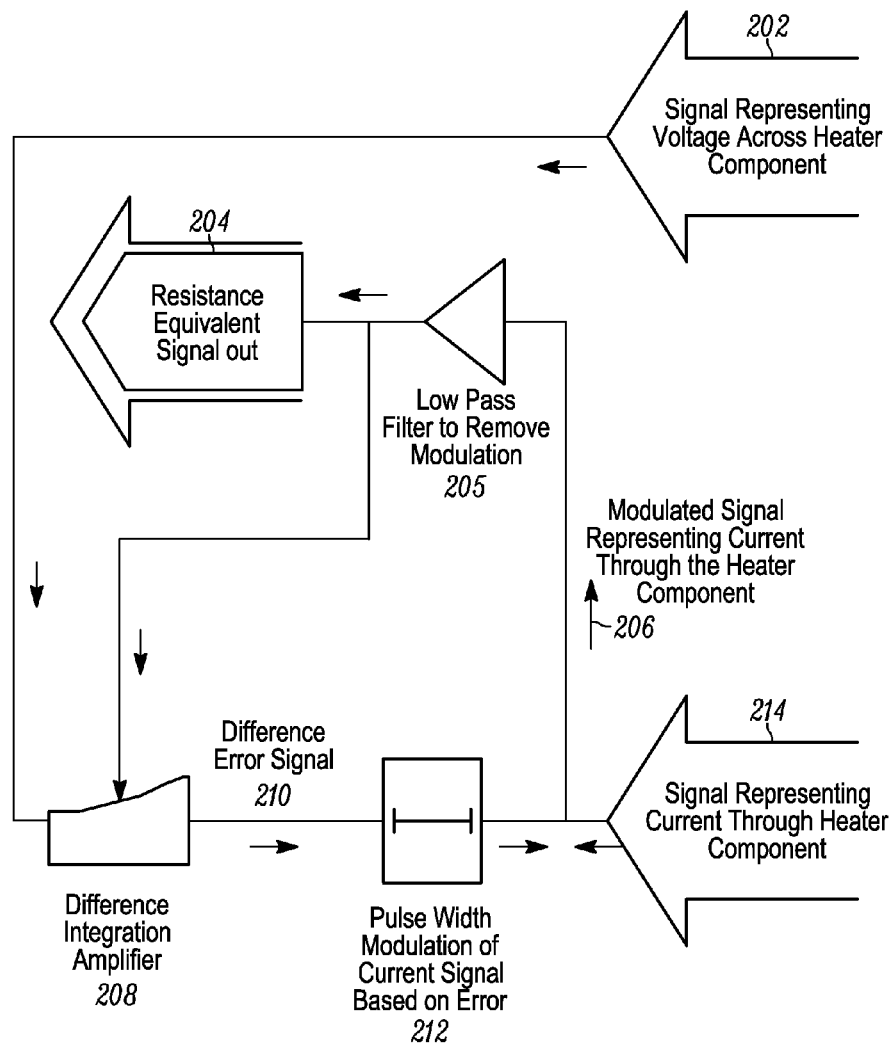
FIG. 2 is a signal flow diagram in accordance with embodiments of the invention.

Referring to FIG. 2, the signal 214 representing current through the heater component 110 is modulated, by pulse width modulator 212, based on the error, or difference, signal 210 between the signal 202 representing voltage across the heater component 110 and a version of the modulated signal 206 representing current through the heater component 110 after it has been low-pass filtered by low-pass filter 205. The result of the modulation is to generate a signal 206 representing the current that is equal to the signal 202 representing the voltage, and the corresponding modulation duty cycle is the equivalent resistance of the heater component 110. The modulated signal 206 is processed through a low pass filter 205 such that the variation of the signal due to modulation frequency is removed to present the modulation correction (not the variation of the pulse width rising and falling signal) or, stated differently, the average of the high level and the low level of the pulse width modulation. The difference between voltage across the heater component and the modulated current through the heater component may be integrated, by difference integration amplifier 208, to drive the error signal 210 to zero. Mathematically, the product of the duty cycle and the current through the heater component is equal to the voltage across the heater component: I(%)=V. Solving for percent duty cycle yields %=V/I, therefore R=V/I is satisfied with % equivalent to R. A resistance equivalent signal 204 is then made available as a signal representing the duty cycle that drives to zero the error 210 between the signal 202 representing voltage across the heater component 110 and the modulated signal 206 representing current through the heater component 110.

Figure 3:
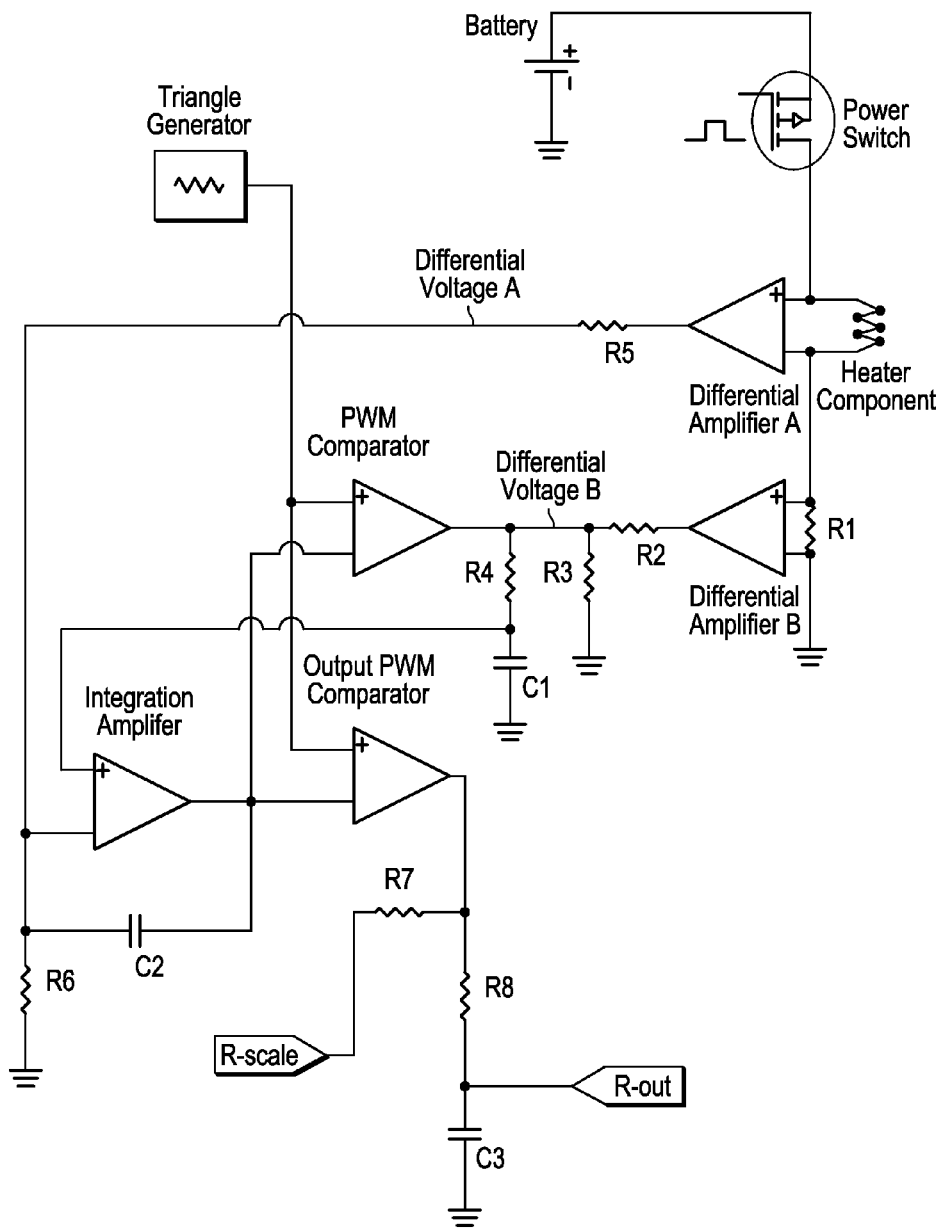
FIG. 3 is a simplified schematic diagram in accordance with embodiments of the invention.

Referring to FIG. 3, an embodiment is described where differential amplifier A provides the signal representing the voltage across the heater component as differential voltage A. Differential amplifier B provides the signal representing the current through the heater component as differential voltage B, scaled by R2 and R3, as desired. The PWM (pulse width modulation) comparator modulates differential voltage B by a signal from the integration amplifier compared to a triangle, or saw-tooth, waveform to generate the pulse width modulation. R4 and C1 are the low pass filter that removes the variation of the high and low PWM values to yield an average voltage representing the modulated differential voltage B. The difference between this modulated voltage and differential voltage A, scaled by R5 and R6, is integrated by C2 to yield the error voltage provided to the PWM comparator and the output PWM comparator. The output PWM comparator is scaled by R-scale through R7 and filtered by the low pass filter, comprising R8 and C3, to yield a voltage, R-out, that represents resistance of the heater component.

Figure 4:
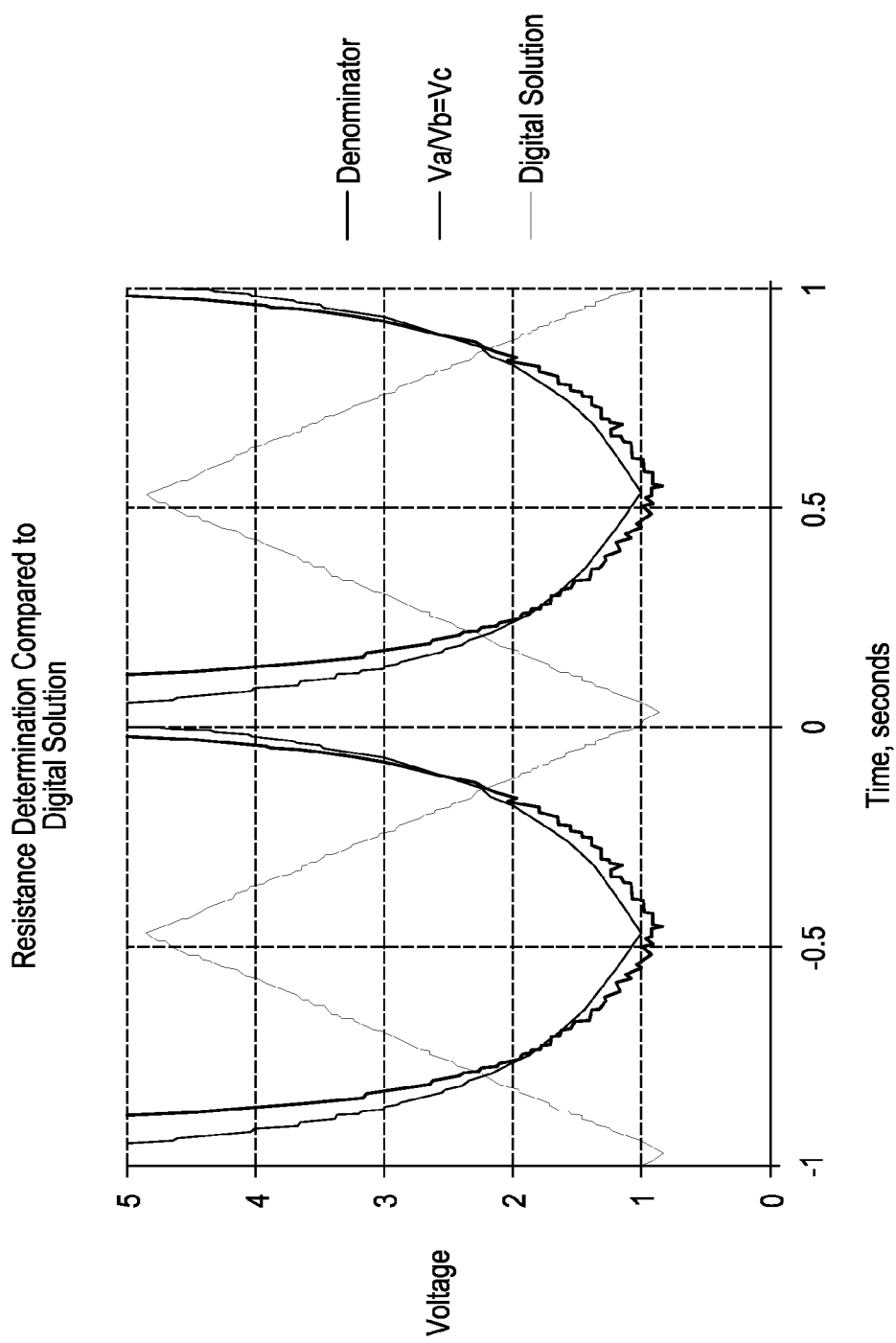
FIG. 4 is a plot of oscilloscope data depicting functionality in accordance with embodiments of the invention.

Referring to FIG. 4, a steady state voltage of 5 volts, not shown, is provided as differential voltage A to a circuit similar to FIG. 3, and a voltage triangle waveform of one Hertz frequency is provided as differential voltage B. The R-out signal is equivalent to Vc and is plotted as Va/Vb=Vc. The digital solution to Va/Vb is simultaneously plotted to show that embodiments of the invention generate a good approximation of R=V/I.

The foregoing detailed description is to be understood as being in every respect illustrative and exemplary, but not restrictive, and the scope of the invention disclosed herein is not to be determined from the description of the invention, but rather from the claims as interpreted according to the full breadth permitted by the patent laws. For example, while the method makes reference to a low side semiconductor switch and a low side current sense resistor, a high side semiconductor switch or high side current sense resistor or any combination thereof as understood by those skilled in the art, will be within the scope of the invention. An additional example is that, while a triangle wave and a comparator are utilized to create a PWM, any other method, such as a microcontroller or dedicated PWM integrated circuit, may be used without departing from the scope of the invention. Further, integration and low pass filtering may be interchanged or supplanted without departing from the scope of the invention. It is to be understood that the embodiments shown and described herein are only illustrative of the principles of the present invention and that various modifications may be implemented by those skilled in the art without departing from the scope and spirit of the invention.

The invention claimed is:

1. A method comprising:
    receiving a voltage-representation signal that is proportional to a voltage across a fuel injector heater component having an electrical resistance;
    receiving a current-representation signal that is proportional to an electrical current passing through the fuel injector heater component;
    pulse-width modulating the current-representation signal to generate a resistance-representation signal having a duty cycle, the duty cycle being proportional to an amount of pulse width modulation that makes the current-representation signal approximately equal to the voltage-representation signal the duty cycle also being substantially equal to a value of the electrical resistance of the fuel injector heater component; and
    low-pass filtering the pulse-width modulated resistance-representation signal; and
    providing from the low-pass filtered, pulse-width modulated resistance-representation signal, an output signal that represents a value of the electrical resistance of the fuel injector heater component.

2. The method of claim 1, wherein the resistance-representation signal is generated, at least in part, based on a pulse-width modulation signal that is proportional to the percent duty cycle of the pulse width modulation.

3. The method of claim 1, wherein a difference of the resistance-representation signal and the voltage-representation signal is integrated to provide an error signal configured to control the pulse width modulation such that the pulse width modulation is proportional to an electrical resistance of the heater component.

4. The method of claim 1, wherein a difference of the resistance-representation signal and the voltage-representation signal is provided as an error signal configured to control the pulse width modulation such that the pulse width modulation is proportional to an electrical resistance of the heater component.

5. The method of claim 1, wherein the resistance-representation signal is scaled such that the resistance-representation signal is proportional to the electrical resistance of the heater component.

6. The method of claim 1, wherein the current-representation signal is generated by a differential voltage measurement of a voltage across a resistor that is passing an amount of current that is, proportionally, approximately the same as an amount of current passing through the heater component.

7. The method of claim 1, wherein the voltage-representation signal is generated by a differential voltage measurement of the fuel injector heater component.

8. Apparatus comprising:
    a low-pass filter that is configured to receive a pulse width modulated current-representation signal that is proportional to an electrical current passing through a fuel injector heater component having a resistance and to provide a resistance-representation signal;

an amplifier configured to generate a difference error signal based on a difference between a voltage-representation signal, which is proportional to a voltage across the fuel injector heater component, and the resistance-representation signal; and a pulse width modulator configured to pulse width modulate the current-representation signal in response to the difference error signal such that the resistance-representation signal is proportional to an amount of pulse width modulation that makes the current-representation signal approximately equal to the voltage-representation signal, the pulse width modulated current representation signal having a duty cycle, which is substantially equal to a value of the resistance of the fuel injector heater.

9. The apparatus of claim 8, wherein the resistance-representation signal is generated, at least in part, based on a signal that is proportional to the percent duty cycle of the pulse-width modulator.

10. The apparatus of claim 8, wherein the amplifier is configured to integrate the difference of the resistance-representation signal and the voltage-representation such that the modulation is proportional to the electrical resistance of the fuel injector heater component.

11. The apparatus of claim 8, wherein the amplifier is configured such that the modulation is proportional to the electrical resistance of the fuel injector heater component.

12. The apparatus of claim 8, wherein the resistance-representation signal is scaled such that the resistance-representation signal is proportional to the electrical resistance of the fuel injector heater component.

13. The apparatus of claim 8, wherein the current-representation signal is generated by a differential voltage measurement of a voltage across a resistor that is passing an amount of current that is, proportionally, approximately the same as an amount of current passing through the fuel injector heater component.

14. The apparatus of claim 8, wherein the voltage-representation signal is generated by a differential voltage measurement of the fuel injector heater component.

* * * * *